United States Patent [19]

Ueda

[11] Patent Number: 5,395,804

[45] Date of Patent: Mar. 7, 1995

[54] METHOD FOR FABRICATING A THIN FILM TRANSISTOR

[75] Inventor: Tohru Ueda, Nara, Japan

[73] Assignee: Sharp Kabushiki Kaisha, Osaka, Japan

[21] Appl. No.: 38,277

[22] Filed: Mar. 29, 1993

[30] Foreign Application Priority Data

May 11, 1992 [JP] Japan .................................. 4-117779

[51] Int. Cl.6 ........................................... H01L 21/469
[52] U.S. Cl. ...................................... 437/233; 437/40; 437/937
[58] Field of Search ................. 437/40, 101, 233, 937, 437/967; 148/DIG. 1, DIG. 122, DIG. 128

[56] References Cited

U.S. PATENT DOCUMENTS 4,992,839  2/1991  Shirai ..................................... 437/84

OTHER PUBLICATIONS

Aoyama et al.: *Extended Abstracts of the 2nd*, (1990 International) Conference on Solid State Devices and Materials, Sendai, 1990, pp. 389–392, "Leakage Currents Reduction of Poly-Si TFT's by Two Step Annealing".

Ikeda et al., *IEDM '90*, 18.1, pp. 469–472, "A Polysilicon Transistor Technology For Large Capacity SRAMs", 1990.

*Primary Examiner*—Tom Thomas
*Assistant Examiner*—Chandra C. Chaudhari
*Attorney, Agent, or Firm*—Nixon & Vanderhye

[57] ABSTRACT

A method for fabricating a thin film transistor formed on an insulator is disclosed. The method includes the steps of forming a non-single crystal silicon film on the insulator, forming a polysilicon film on the insulator by thermally treating the non-single crystal silicon film in an atmosphere of a gas including hydrogen halogenide, and forming a channel region in the polysilicon film.

13 Claims, 7 Drawing Sheets

METHOD FOR FABRICATING A THIN FILM TRANSISTOR

BACKGROUND OF THE INVENTION

1. Field of the Invention

The present invention relates to a method for fabricating a thin film transistor having a channel region formed of a polysilicon film.

2. Description of the Related Art

A thin film transistor (TFT) including a MOSFET (metal oxide semiconductor field effect transistor) having a channel region formed of a polysilicon film has been widely used as a load element in the memory cell for a complete CMOS (complementary metal oxide semiconductor) type static random access memory (SRAM) or as a switching element in a pixel and a circuit element for the circuit connected thereto for a "driver-monolithic" type liquid crystal display (LCD) apparatus. Since such a TFT is used for loading a memory cell or driving a LCD, characteristics of rapid response speed and a minimized leakage current are required. The leakage current is thought to originate from field emission of carriers through trap states in the grain boundaries of drain junction regions in the TFT. Therefore, in order to provide the TFT with these characteristics, the polysilicon film used for the channel region of the TFT needs to have excellent crystallinity with a reduced number of defects such as localized trap states.

A method for fabricating a TFT having a polysilicon film with high crystallinity has been proposed, for example, in T. Aoyama, et al., "Extended Abstracts of the 22nd (1990 International) Conference on Solid State Devices and Materials", pp. 389–392 (1990).

Figure 17:
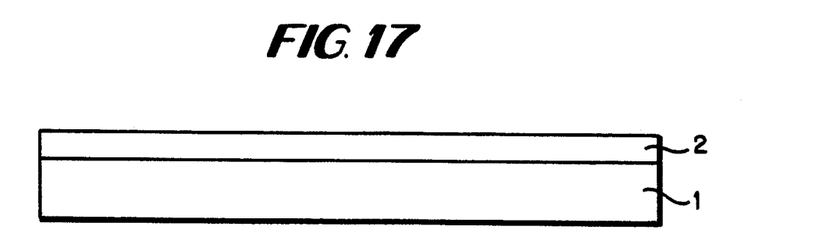
FIGS. 17 to 19 are sectional views showing steps for fabricating a TFT of a conventional method.
Figure 18:
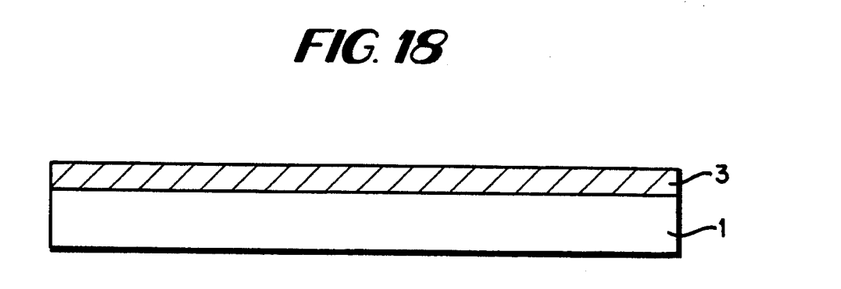
Figure 19:
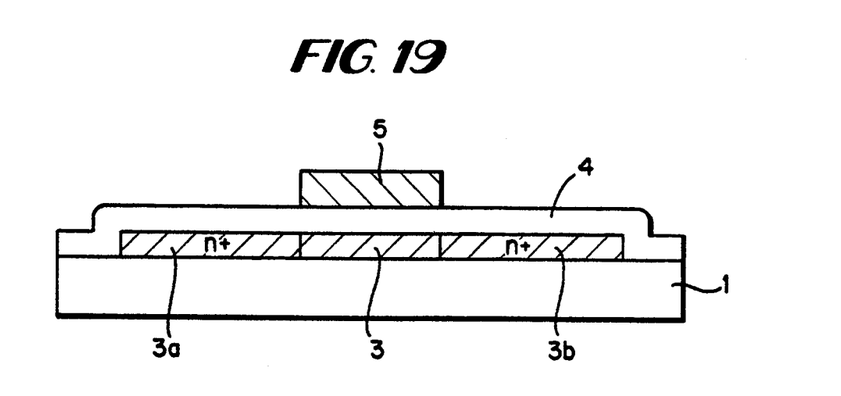

This method will be described with reference to FIGS. 17 to 19. Referring to FIG. 17, an amorphous silicon film 2 with a thickness of 80 nm is formed on an insulating substrate 1 by low pressure chemical vapor deposition (LPCVD) at 500° C. Then, as shown in FIG. 18, the amorphous silicon film 2 is thermally treated (polycrystallized) in a nitrogen ($N_2$) atmosphere at 600° C. for 20 hours in order to form a polysilicon film 3. The polysilicon film 3 is patterned to form an active area. Thereafter, as shown in FIG. 19, a gate insulating film 4 made of silicon oxide is formed to cover the polysilicon film 3. Then, a gate electrode 5 made of polysilicon is formed on a portion of the gate insulating film 4. Phosphorus (P) ions are implanted in portions of the polysilicon film 3 using the gate electrode 5 as a mask, thereby to form an n+-type source and drain regions 3a and 3b. Finally, another heat treatment in a nitrogen atmosphere is conducted at 1000° C. for one hour so as to activate the implanted phosphorus impurities and to simultaneously repair defects in the polycrystals of the polysilicon film 3.

Another method for fabricating a TFT having a polysilicon film with high crystallinity is described in S. Ikeda, et al., "IEDM 90", p. 469.

Figure 20:
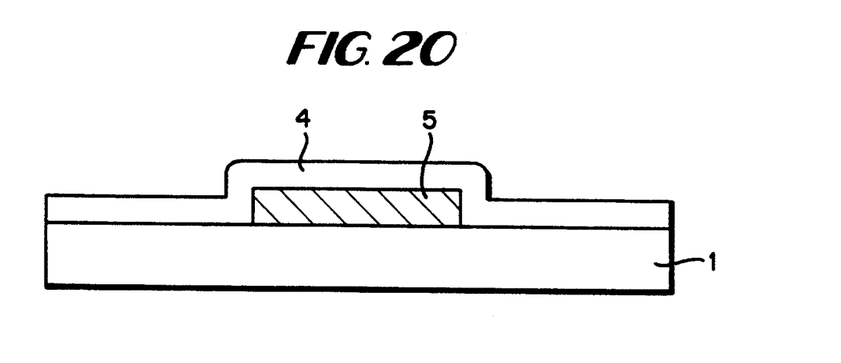
FIGS. 20 to 23 are sectional views showing steps for fabricating a TFT of another conventional method.
Figure 21:
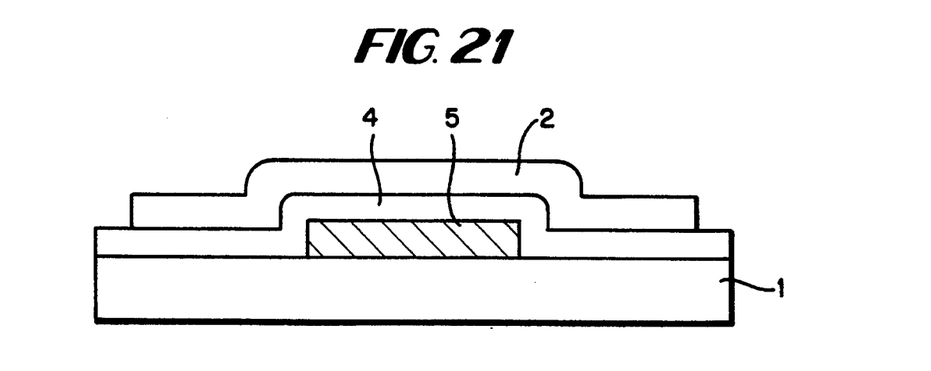
Figure 22:
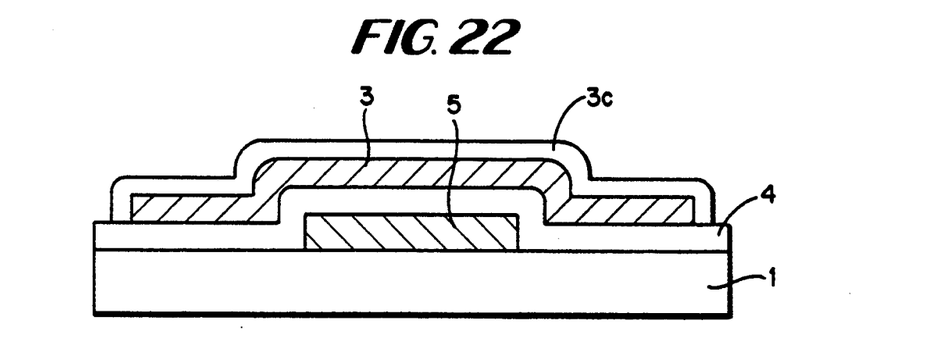
Figure 23:
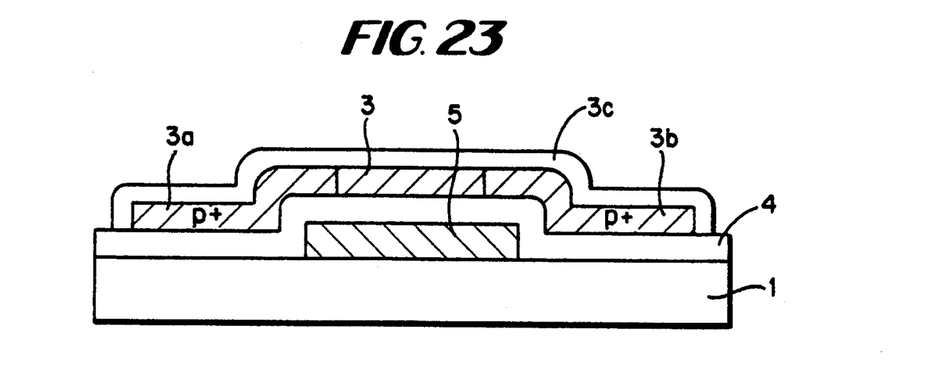

This method will be described with reference to FIGS. 20 to 23. Referring to FIG. 20, a gate electrode 5 is formed on a portion of an insulating substrate 1, and the gate electrode 5 and the insulating substrate 1 are covered with a gate insulating film 4 made of silicon oxide deposited by LPCVD. Thereafter, as shown in FIG. 21, an amorphous silicon film 2 with a thickness of 40 nm is formed on the gate insulating film 4 by LPCVD at 520° C. using monosilane ($SiH_4$) as a material gas. As shown in FIG. 22, the amorphous silicon film 2 is polycrystallized by heat treatment in an oxygen ($O_2$) atmosphere at 800° C. for 10 minutes so as to form a polysilicon film 3. At this time, the exposed surface portion of the polysilicon film 3 is oxidized to form a silicon oxide film 3c. Then, as shown in FIG. 23, boron (B) ions are implanted in portions of the polysilicon film 3 using an appropriate mask, thereby to form p+-type source and drain regions 3a and 3b. Finally, another heat treatment in a nitrogen atmosphere is conducted at 850° C. for 20 minutes so as to activate the implanted boron impurities and simultaneously to repair defects in the polycrystals of the polysilicon film 3.

However, according to the above-described conventional methods, the polysilicon film 3 is simply thermally treated in the nitrogen or oxygen atmosphere, and the repair of defects in the polycrystals is conducted by use of an annealing effect produced by the thermal treatment. With such a process by annealing, only a limited extent of repair of defects is possible. As a result, a polysilicon film with sufficiently high crystallinity can not be obtained by these conventional methods.

SUMMARY OF THE INVENTION

The method for fabricating a thin film transistor of this invention comprises the steps of: forming a non-single crystal silicon film on an insulator; forming a polysilicon film on the insulator by thermally treating the non-single crystal silicon film in an atmosphere of a gas including hydrogen halogenide, and forming a channel region in the polysilicon film.

According to the method for fabricating a thin film transistor of the present invention, defects in the polysilicon film used for the channel region of the thin film transistor can be repaired not only by annealing, but also by mainly terminating dangling bonds with halogen atoms. Accordingly, the crystallinity of the polysilicon film can be improved, so that a TFT with rapid response speed and minimized leakage current can be obtained. Further, the surface of the polysilicon film can be protected from being etched with the hydrogen halogenide by being covered with a silicon oxide film.

Thus, the invention described herein makes possible the advantage of providing a method for fabricating a thin film transistor having a polysilicon film with sufficiently high crystallinity for the channel region.

This and other advantages of the present invention will become apparent to those skilled in the art upon reading and understanding the following detailed description with reference to the accompanying figures.

DESCRIPTION OF THE PREFERRED EMBODIMENTS

First, how defects in the amorphous silicon film or the polysilicon film (the non-single crystal silicon film) can be repaired according to the present invention will be described.

An amorphous silicon film deposited on a substrate by chemical vapor deposition (CVD) or the like is polycrystallized in an inert atmosphere, for example, so as to form a polysilicon film. Such a polysilicon film, however, has a number of defects in the polycrystals thereof. In this example, the amorphous silicon film formed on the substrate by CVD or the polysilicon film formed by the aforementioned polycrystallization is thermally treated in an atmosphere of a mixed gas of hydrogen halogenide and an oxidative gas. When the amorphous silicon film is directly subjected to this heat treatment, it is first polycrystallized in order to form a polysilicon film. The thus-obtained polysilicon film also has a number of defects in grain boundaries of the polycrystals.

The halogen elements for hydrogen halogenide include fluorine (F), chlorine (I), bromine (Br), iodine (I), and astatine (At). Astatine is a radioactive element and only a slight amount thereof exists. Thus, no practical use is possible. The hydrogen halogenides include hydrogen fluoride (HF), hydrogen chloride (HCl), hydrogen bromide (HBr), and hydrogen iodide (HI). The oxidative gases include oxygen ($O_2$) and nitrous oxide ($N_2O$).

The heat treatment in an atmosphere of a mixed gas of hydrogen halogenide and an oxidative gas causes thermal annealing for the polysilicon film (including the polysilicon film polycrystallized by this heat treatment), and defects in the polycrystals can be repaired to some extent. Simultaneously, the halogen atoms contained in the hydrogen halogenide diffuse in the polysilicon film, and dangling bonds are terminated with the halogen atoms. Moreover, the oxidative gas oxidizes the surface portion of the polysilicon film, forming a silicon oxide film. The silicon oxide film protects the surface of the polysilicon film from being etched with the hydrogen halogenide.

EXAMPLE 1

Figure 4:
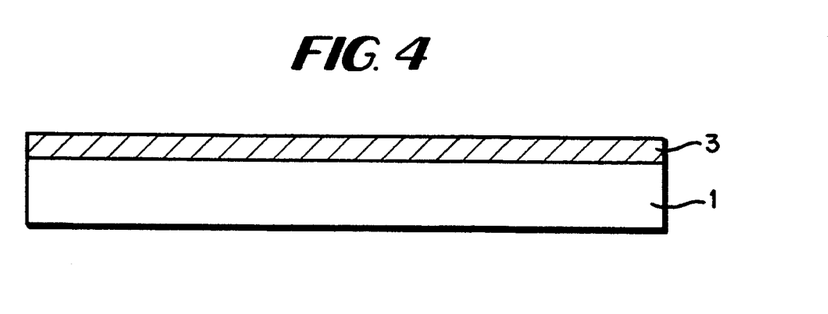
Figure 5:
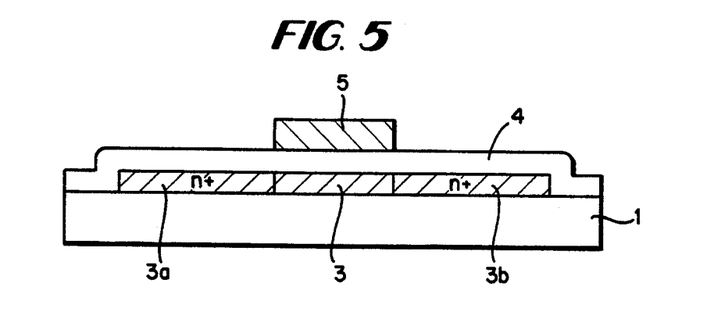
Figure 6:
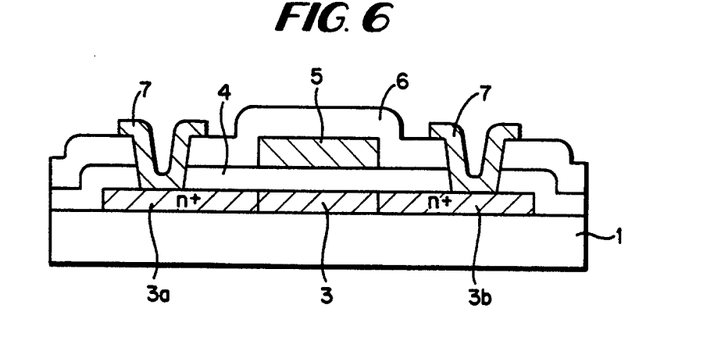
FIG. 6 is a sectional view of a TFT fabricated according to the method shown in FIGS. 1 to 5.

FIGS. 1 to 5 are longitudinal sectional views illustrating steps for fabricating a TFT according to a method of the present invention. FIG. 6 is a longitudinal sectional view showing a TFT fabricated according to this method. Like components are denoted as like reference numerals as in the conventional examples described above with reference to FIGS. 17 to 23.

The method for fabricating a TFT of this example will now be described.

Figure 1:
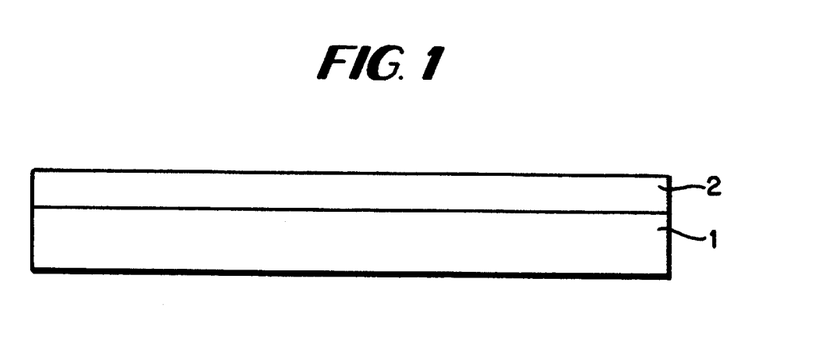
FIGS. 1 to 5 are sectional views showing steps for fabricating a TFT according to a method of the present invention.
Figure 2:
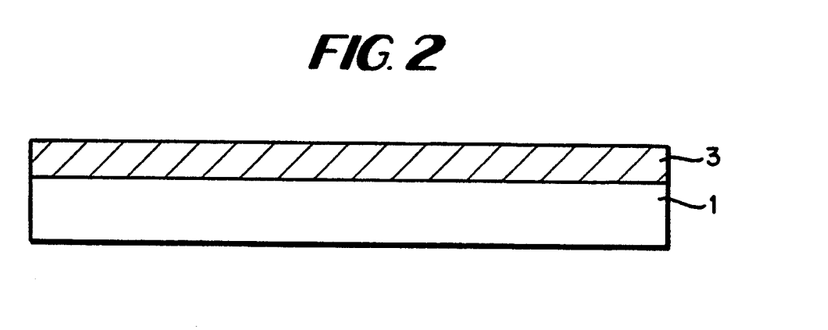

Referring to FIG. 1, an amorphous silicon film 2 with a thickness of 110 nm is formed on an insulating substrate 1 by LPCVD at 500° C. As material gases, 100 sccm of disilane ($Si_2H_6$) and 400 sccm of nitrogen are used, and the pressure applied is 50 Pa. Then, as shown in FIG. 2, the amorphous silicon film 2 is polycrystallized by heat treatment in a nitrogen atmosphere at 600° C. for 24 hours so as to form a polysilicon film 3. The polysilicon film 3 at this stage has a number of defects in the polycrystals thereof.

Figure 3:
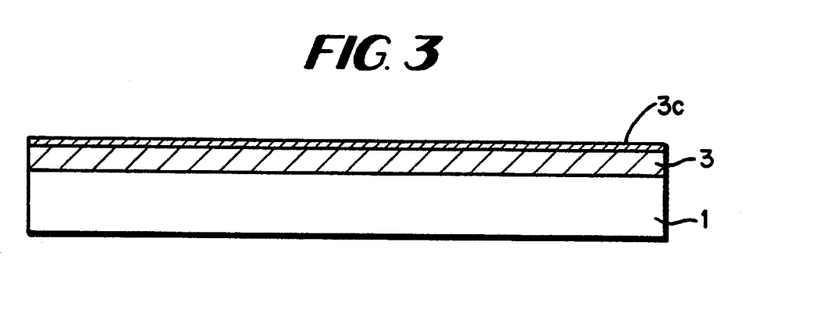

The polysilicon film 3 formed on the insulating substrate 1 is then subjected to thermal oxidation in an atmosphere of a mixed gas of hydrogen chloride and oxygen at 950° C. for 120 minutes. The flow rates of the hydrogen chloride and the oxygen are 0.24 liter/min and 8 liter/min, respectively. In this step, as shown in FIG. 3, the surface portion of the polysilicon film 3 is oxidized in order to form a silicon oxide film 3c with a thickness of 60 nm. The silicon oxide film 3c protects the polysilicon film 3 from being etched with the hydrogen chloride. Also, in this step, defects in the polycrystals of the polysilicon film 3 are repaired to some extent due to the thermal annealing effect. Furthermore, chlorine atoms contained in the hydrogen chloride diffuse in the polysilicon film 3, and dangling bonds are terminated with the halogen atoms. Other hydrogen halogenides may be used instead of hydrogen chloride. Likewise, other oxidative gases such as nitrous oxide may be used instead of oxygen.

As shown in FIG. 4, after the completion of the thermal oxidation, the silicon oxide film 3c is removed by a buffered hydrofluoric acid (BHF) with a ratio of 10:1. Thereafter, the polysilicon film 3 is patterned so as to form an active area. Then, as shown in FIG. 5, silicon oxide is deposited to a thickness of 85 nm by LPCVD in order to form a gate insulating film 4 covering the polysilicon film 3 and the insulating substrate 1. Then, a gate electrode 5 made of silicon doped with phosphorous is formed on a portion of the gate insulating film 4. Phosphorus ions are implanted in portions of the polysilicon film 3 using the gate electrode 5 as a mask under the conditions of an accelerating energy of 100 keV and a dose of $1 \times 10^{15} cm^{-2}$, thereby forming an $n^+$-type source and drain regions 3a and 3b. A region between the source region 3a and the drain region 3b in the polysilicon film 3 constitutes a channel region.

As shown in FIG. 6, after the formation of the source region 3a and the drain region 3b in the polysilicon film 3, an interlevel insulating film 6 with a thickness of 500 nm is formed so as to cover the gate insulating film 4 and the gate electrode 5. Then, another heat treatment in a nitrogen atmosphere is performed at 900° C. for 30 minutes in order to activate the impurities. Finally, contact holes are formed and electrodes 7 made of aluminum having 1% silicon mixed therein (Al—Si) are formed covering the contact holes thus to complete a TFT.

Thus, according to the method for fabricating a TFT of this example, at the thermal oxidation of the polysilicon film 3, defects in the polycrystals can be repaired not only by annealing, but also by mainly terminating dangling bonds with halogen atoms such as chlorine atoms. Accordingly, the crystallinity of the polysilicon film 3 used for the channel region can be improved, so that a TFT with rapid response speed and minimized leakage current can be obtained. Further, by using the oxidative gas during the thermal oxidation, the silicon oxide film 3c is formed all over the exposed surface of the polysilicon film 3, so that the polysilicon film 3 can be prevented from being etched with hydrogen chloride or the like.

The heating at the thermal oxidation in the step shown in FIG. 3 or the like, according to this example, can be performed by irradiating the polysilicon film 3 with light from an infrared lamp or an ultraviolet (UV) lamp or with laser light from an argon ion laser or an excimer laser. At such irradiation of the polysilicon film 3, the insulating substrate 1 itself may also be heated to 400°–600° C., for example.

According to this example, in the step shown in FIG. 2, the amorphous silicon film 2 formed on the insulating substrate 1 is polycrystallized so as to form the polysilicon film 3 by the heat treatment in the nitrogen atmosphere. This step can be omitted and the amorphous silicon film 2 can be directly subjected to the thermal oxidation in the step shown in FIG. 3 so as to polycrystallize it at this step in order to form the polysilicon film 3.

As an alternative, a mixed gas of hydrogen halogenide such as hydrogen chloride and an inert gas can be used for a thermal treatment, instead of the thermal oxidation using the oxidative gas in the step shown in FIG. 3. The inert gases include nitrogen, argon (Ar), and helium (He). For example, when hydrogen chloride and nitrogen are used, the polysilicon film 3 can be treated at 950° C. for 120 minutes with flow rates of the hydrogen chloride and the nitrogen of 0.24 liter/min and 8 liter/min, respectively, so as to obtain the same effect as in the above example.

In this case, however, since no oxidative gas is used at this heat treatment, the surface of the polysilicon film uncovered with a silicon oxide film may be etched with hydrogen chloride. Therefore, in the case where such etching arises a problem, a silicon oxide film with a thickness of approximately 50 nm may previously be formed on the polysilicon film 3 by CVD as a protective film. This silicon oxide film should be formed at a temperature lower than the temperature at which the thermal treatment with hydrogen halogenide is conducted.

Also, only hydrogen halogenide such as hydrogen chloride can be used for the above heat treatment to obtain the same effect as above. However, though the presence or absence of the inert gas is irrelevant to the effect of the present invention, it is desired for safety reasons to use hydrogen halogenide diluted with an inert gas.

EXAMPLE 2

Figure 9:
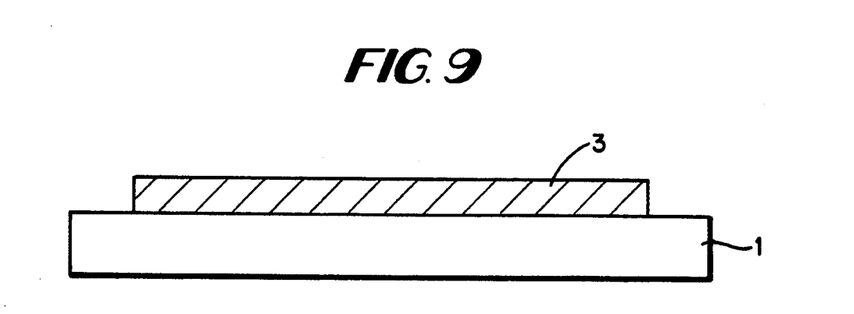
Figure 10:
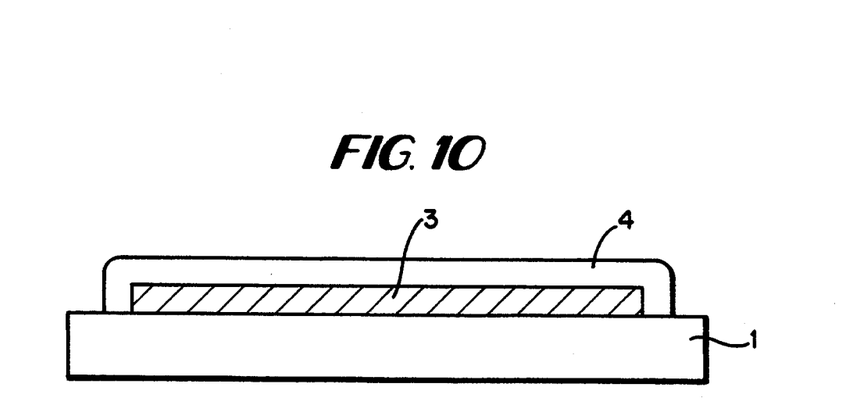
Figure 11:
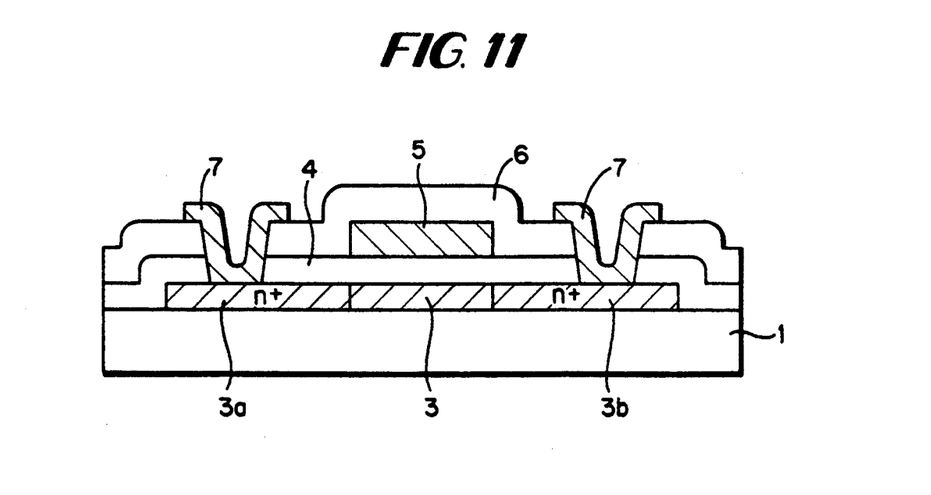
FIG. 11 is a sectional view of a TFT fabricated according to the method shown in FIGS. 7 to 10.

Another method for fabricating a TFT according to the present invention will be described with reference to FIGS. 7 to 11. FIGS. 7 to 10 are longitudinal sectional views showing steps for fabricating a TFT according to this method, and FIG. 11 is a longitudinal sectional view showing a TFT fabricated according to this method. Like components are denoted as like reference numerals as in Example 1 shown in FIGS. 1 to 6.

Figure 7:
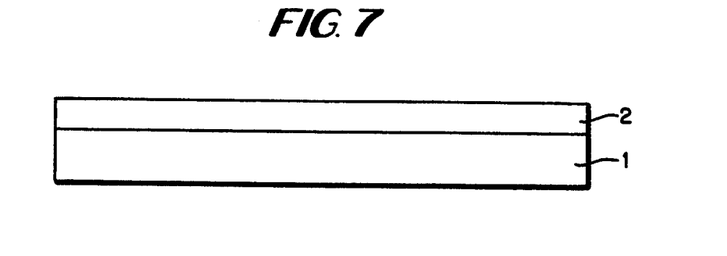
FIGS. 7 to 10 are sectional views showing steps for fabricating a TFT according to another method of the present invention.
Figure 8:
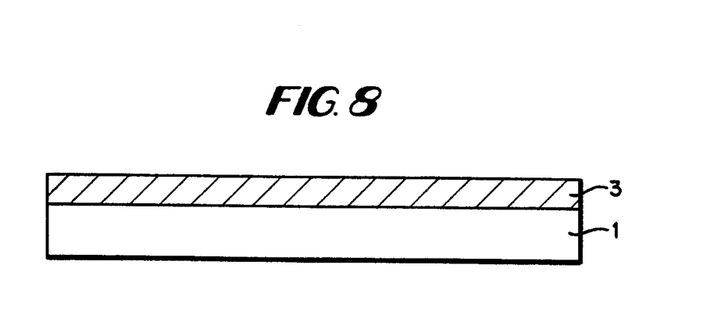

The steps shown in FIGS. 7 and 8 are the same as the steps in Example 1 shown in FIGS. 1 and 2, respectively. Referring to FIG. 9, a polysilicon film 3 formed in the above steps is first patterned so as to form active areas, and then subjected to thermal oxidation in an atmosphere of a mixed gas of hydrogen chloride and oxygen. In this step, as shown in FIG. 10, the surface portion of the patterned polysilicon film 3 is oxidized to form a silicon oxide film covering the polysilicon film 3 completely. This silicon oxide film does not need to be removed but can be used as a gate insulating film 4. Thus, as shown in FIG. 11, a gate electrode 5 is formed directly on this gate insulating film 4. Then, using the gate electrode 5 as a mask, phosphorous ions are implanted in portions of the polysilicon film 3 so as to form an n+-type source and drain regions 3a and 3b. Then, an interlevel insulating film 6 is formed to cover the gate insulating film 4 and the gate electrode 5. Finally, contact holes are formed and electrodes 7 are formed covering the contact holes, thus to complete a TFT having the same structure as that in Example 1.

Thus, according to the method for fabricating a TFT of this example, as in Example 1, defects in the polycrystals can be repaired not only by annealing due to the thermal oxidation, but also by mainly terminating dangling bonds with halogen atoms such as chlorine atoms. Accordingly, the crystallinity of the polysilicon film 3 can be improved. Further, at this oxidation, the silicon oxide film is formed all over the exposed surface of the polysilicon film 3, so that the polysilicon film 3 can be prevented from being etched with hydrogen chloride or the like. Moreover, in this example, since the silicon oxide film can be used as the gate insluting film 4, an additional step of forming the gate insulating film 4 can be omitted.

EXAMPLE 3

Figure 15:
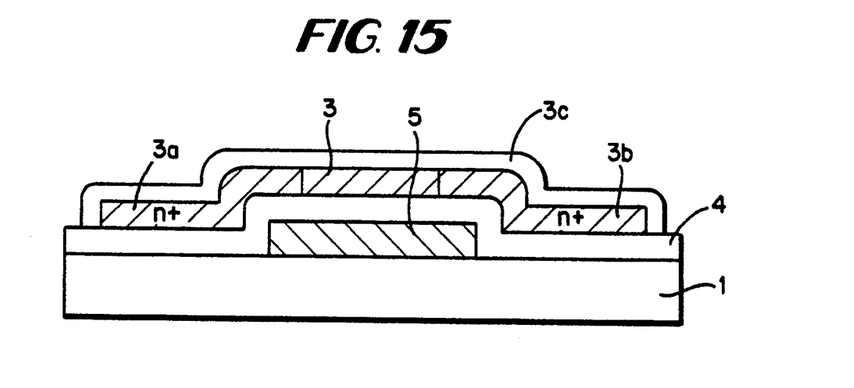
Figure 16:
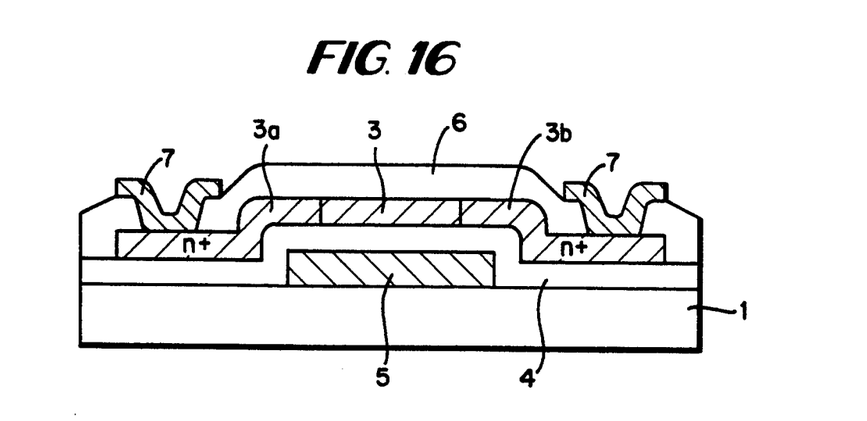
FIG. 16 is a sectional view of a TFT fabricated according to the method shown in FIGS. 12 to 15.

Yet another method for fabricating a TFT according to the present invention will be described with reference to FIGS. 12 to 16. FIGS. 12 to 15 are longitudinal sectional views showing steps for fabricating a TFT according to this method, and FIG. 16 is a longitudinal sectional view showing a TFT fabricated according to this method. Like components are denoted as like reference numerals as in Examples 1 and 2 shown in FIGS. 1 to 11.

Figure 12:
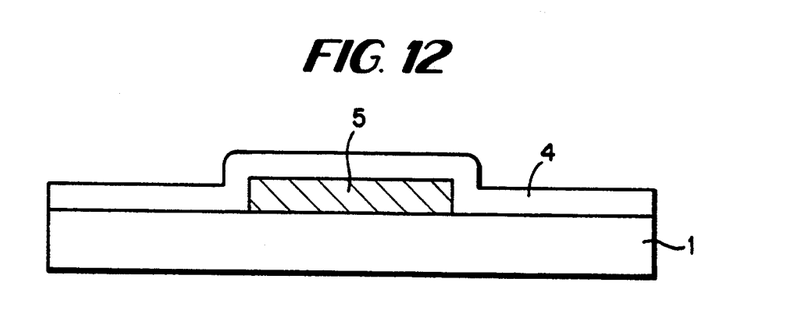
FIGS. 12 to 15 are sectional views showing steps for fabricating a TFT according to yet another method of the present invention.
Figure 13:
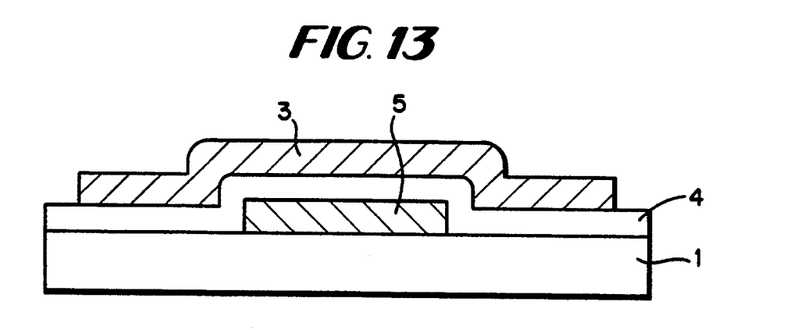

According to the method of this example, first, a gate electrode 5 is directly formed on an insulating substrate 1. As shown in FIG. 12, a gate insulating film 4 is formed by CVD to cover the insluting substrate 1 and the gate electrode 5 formed thereon. Then, amorphous silicon is deposited on the gate insulating film 4 and, as shown in FIG. 13, it is polycrystallized in a nitrogen atmosphere so as to form the polysilicon film 3.

Figure 14:
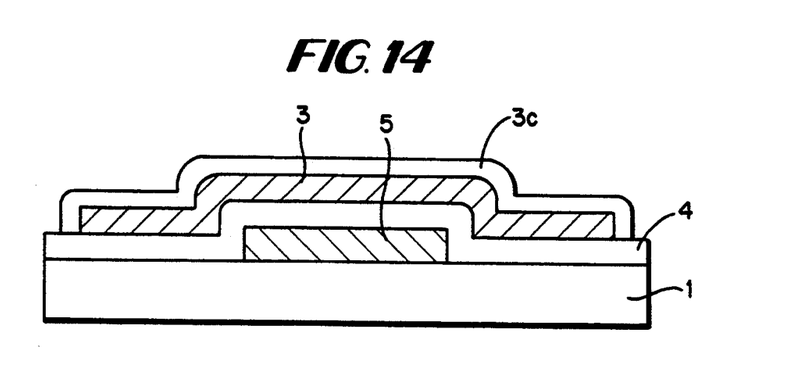

Then, as shown in FIG. 14, the polysilicon film 3 is subjected to heat oxidation in an atmosphere of a mixed gas of hydrogen chloride and oxygen. In this step, the surface portion of the polysilicon film 3 is oxidized to form a silicon oxide film 3c covering the polysilicon film 3. Thereafter, as shown in FIG. 15, phosphorous ions are implanted in portions of the polysilicon film 3 using an appropriate mask so as to form an n+-type source and drain regions 3a and 3b. Then, as shown in FIG. 16, an interlevel insulating film 6 is formed to cover the polysilicon film 3. Finally, contact holes are formed and electrodes 7 are formed covering the contact holes thus to complete a TFT.

Thus, according to the method for fabricating a TFT of this example, as in Examples 1 and 2, defects in the polycrystals can be repaired not only by annealing due to the thermal oxidation, but also by mainly terminating dangling bonds with halogen atoms such as chlorine atoms. Accordingly, the crystallinity of the polysilicon film 3 can be improved. Further, the silicon oxide film 3c is formed all over the exposed surface of the polysilicon film 3, so that the polysilicon film 3 can be prevented from being etched with hydrogen chloride or the like.

For a quantitative assessment of the effect of the present invention, the density of dangling bonds in the polysilicon film was measured by electron spin resonance analysis (ESR). The following three samples were prepared for this measurement in the manner described below.

First, amorphous silicon was deposited on an insulating substrate to a thickness of 110 nm by LPCVD at 500° C. As material gases, 100 sccm of disilane (Si$_2$H$_6$) and 400 sccm of nitrogen were used. The pressure applied was 50 Pa. Then, the amorphous silicon was polycrystallized in a nitrogen atmosphere at 600° C. for 24 hours so as to form a polysilicon film.

Thereafter, for the first sample, the polysilicon film was subjected to thermal oxidation in an atmosphere of a mixed gas of hydrogen chloride and oxygen at 950° C. for 120 minutes. The flow rates of the hydrogen chloride and the oxygen were 0.24 liter/min and 8 liter/min, respectively. As a result, a silicon oxide film with a thickness of 60 nm was formed.

For the second sample, the polysilicon film was subjected to thermal oxidation in an oxygen atmosphere at 950° C. for 120 minutes. The flow rate of the oxygen was 8 liter/min. As a result, a silicon oxide film with a thickness of 60 nm was formed.

For the third sample, the polysilicon film was subjected to heat treatment in a nitrogen atmosphere at 950° C. for 30 minutes. The flow rate of the nitrogen was 10 liter/min.

The density of dangling bonds was measured by ESR for the polysilicon film before the heat treatment and the polysilicon films of the first, second, and third samples, and the results were $5.2 \times 10^{17}$ cm$^{-3}$, $7 \times 10^{16}$ cm$^{-3}$, $1.4 \times 10^{17}$ cm$^{-3}$, and $2.5 \times 10^{17}$ cm$^{-3}$, respectively As is seen from the above results, the first sample showed the lowest density of dangling bonds. Thus, it was confirmed that the polysilicon film obtained according to the method of the present invention had excellent crystallinity.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a thin film transistor formed on an insulator, comprising the steps of:
    forming a non-single crystal silicon film on said insulator;
    forming a polysilicon film on said insulator by thermally treating said non-single crystal silicon film in an atmosphere of a gas mixture including a hydrogen halogenide gas and an oxidative gas; and
    forming a channel region in said polysilicon film.

2. A method according to claim 1, wherein said gas mixture further includes an inert gas.

3. A method according to claim 1, further comprising a step of forming a silicon oxide film on a surface of said polysilicon film by thermally treating said non-single crystal silicon film in the atmosphere of said gas mixture.

4. A method according to claim 3, further comprising a step of forming a gate insulating film made of said silicon oxide film.

5. A method according to claim 3, further comprising a step of forming a gate insulating film made of said silicon oxide film and a step of forming a gate electrode on a portion of said gate insulating film.

6. A method for fabricating a thin film transistor formed on an insulator, comprising the steps of:
    forming a non-single crystal silicon film on said insulator;
    forming a silicon oxide film on said non-single crystal silicon film;
    forming a polysilicon film on said insulator by thermally treating said non-single crystal silicon film in an atmosphere including a hydrogen halogenide; and
    forming a channel region in said polysilicon film.

7. A method according to claim 6, said atmosphere further includes an inert gas.

8. A method according to claim 7, further comprising a step of forming a gate insulating film made of said silicon oxide film.

9. A method according to claim 1, wherein said step of forming said polysilicon film is performed at a temperature which is sufficiently high so that defects in said non-single crystal silicon film are repaired to some extent due to a thermal annealing effect.

10. A method according to claim 9, wherein said temperature is approximately 950° C.

11. A method according to claim 6, wherein said step of forming said polysilicon film is performed at a temperature which is sufficiently high so that defects in said non-single crystal silicon film are repaired to some extent due to a thermal annealing effect.

12. A method according to claim 11, wherein said temperature is approximately 950° C.

13. A method according to claim 6, further comprising a step of forming a gate insulating film made of said silicon oxide film.

* * * * *